(12) United States Patent
Dominguez et al.

(10) Patent No.: US 10,790,257 B2
(45) Date of Patent: Sep. 29, 2020

(54) ACTIVE PACKAGE SUBSTRATE HAVING ANISOTROPIC CONDUCTIVE LAYER

(71) Applicant: Intel Corporation, Santa Clara, CA (US)

(72) Inventors: Juan Eduardo Dominguez, Gilbert, AZ (US); Hyoung Il Kim, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 16/323,402

(22) PCT Filed: Sep. 30, 2016

(86) PCT No.: PCT/US2016/054957
§ 371 (c)(1),
(2) Date: Feb. 5, 2019

(87) PCT Pub. No.: WO2018/063383
PCT Pub. Date: Apr. 5, 2018

(65) Prior Publication Data
US 2020/0066670 A1 Feb. 27, 2020

(51) Int. Cl.
*H01L 23/31* (2006.01)
*H01L 23/498* (2006.01)
(Continued)

(52) U.S. Cl.
CPC .............. *H01L 24/29* (2013.01); *H01L 21/56* (2013.01); *H01L 23/3121* (2013.01);
(Continued)

(58) Field of Classification Search
CPC ......... H01L 23/12–15; H01L 23/49833; H01L 23/5226; H01L 23/5389; H01L 24/26–33;
(Continued)

(56) References Cited

U.S. PATENT DOCUMENTS 6,720,644 B2 * 4/2004 Yoshizawa .......... H01L 21/4857
257/692
6,909,054 B2 * 6/2005 Sakamoto ............... H01L 23/13
174/260

(Continued)

FOREIGN PATENT DOCUMENTS

KR 10-2012-0000483 1/2012

OTHER PUBLICATIONS

International Search Report and Written Opinion for International Patent Application No. PCT/US2016/054957 dated Jun. 28, 2017, 11 pgs.

(Continued)

*Primary Examiner* — Jose R Diaz
(74) *Attorney, Agent, or Firm* — Schwabe, Williamson & Wyatt, P.C.

(57) ABSTRACT

Semiconductor packages including active package substrates are described. In an example, the active package substrate includes an active die between a top substrate layer and a bottom substrate layer. The top substrate layer may include a via and the active die may include a die pad. An anisotropic conductive layer may be disposed between the via and the die pad to conduct electrical current unidirectionally between the via and the die pad. In an embodiment, the active die is a flash memory controller and a memory die is mounted on the top substrate layer and placed in electrical communication with the flash memory controller through the anisotropic conductive layer.

20 Claims, 8 Drawing Sheets

DETAIL A

(51) Int. Cl.
- *H01L 23/538* (2006.01)
- *H01L 21/56* (2006.01)
- *H01L 23/00* (2006.01)
- *H01L 25/18* (2006.01)

(52) U.S. Cl.
CPC .. *H01L 23/49827* (2013.01); *H01L 23/49833* (2013.01); *H01L 23/5389* (2013.01); *H01L 24/05* (2013.01); *H01L 24/27* (2013.01); *H01L 24/83* (2013.01); *H01L 25/18* (2013.01); *H01L 24/13* (2013.01); *H01L 2224/04026* (2013.01); *H01L 2224/04105* (2013.01); *H01L 2224/83851* (2013.01)

(58) Field of Classification Search
CPC ......... H01L 24/83; H01L 2224/73103–73104; H01L 2224/73153; H01L 21/76802–76805; H01L 25/043; H01L 25/0657; H01L 25/074; H01L 25/0756; H01L 25/117

See application file for complete search history.

(56) References Cited

U.S. PATENT DOCUMENTS

| | | |
|---|---|---|
| 10,049,928 B2 | 8/2018 | Shih et al. |
| 2008/0099903 A1 | 5/2008 | Shen |
| 2011/0210438 A1 | 9/2011 | Sweeney et al. |
| 2011/0227223 A1 | 9/2011 | Wu et al. |
| 2016/0079220 A1 | 3/2016 | Lin et al. |

OTHER PUBLICATIONS

International Preliminary Report on Patentability for International Patent Application No. PCT/US2016/054957, dated Apr. 11, 2019, 6 pgs.

\* cited by examiner

DETAIL A

DETAIL A

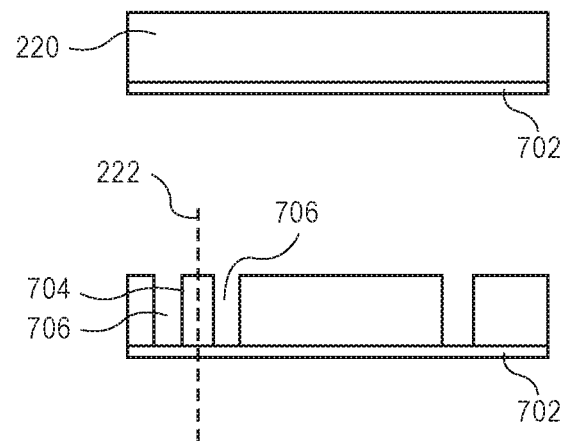
Figure 7A
Figure 7B
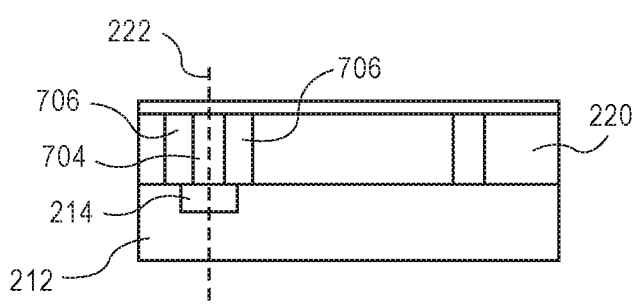
Figure 7C
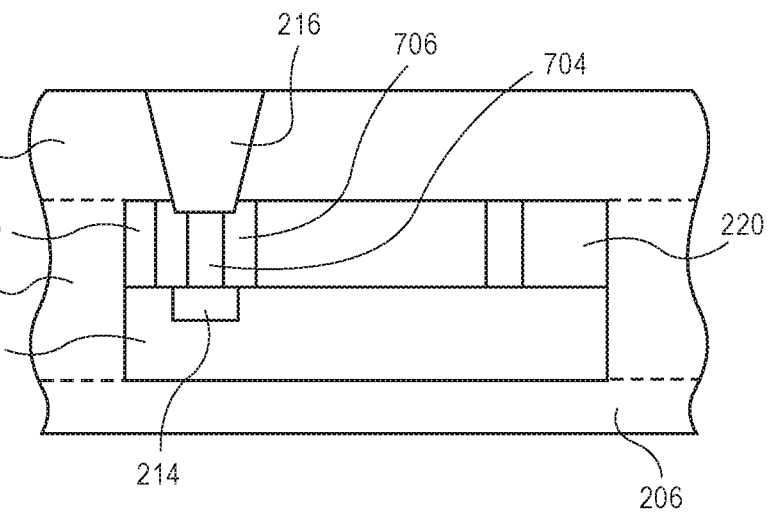
Figure 7D

ACTIVE PACKAGE SUBSTRATE HAVING ANISOTROPIC CONDUCTIVE LAYER

CROSS-REFERENCE TO RELATED APPLICATION

This patent application is a U.S. National Phase Application under 35 U.S.C. § 371 of International Application No. PCT/US2016/054957, filed Sep. 30, 2016, entitled "ACTIVE PACKAGE SUBSTRATE HAVING ANISOTROPIC CONDUCTIVE LAYER," which designates the United States of America, the entire disclosure of which is hereby incorporated by reference in its entirety and for all purposes.

TECHNICAL FIELD

Embodiments are in the field of integrated circuit packages and, in particular, semiconductor packages including package substrates having embedded dies.

BACKGROUND

Non-volatile memory systems, such as flash memory devices, may include several memory dies controlled by a memory controller. For example, a flash memory controller may manage data stored in the memory dies of a memory stack. As the art of non-volatile memory solutions evolves, a form factor of the memory systems is expected to decrease. More particularly, to meet the requirements for mobile and ultra-mobile markets, a z-height and an x-y area of memory devices is expected to shrink.

BRIEF DESCRIPTION OF THE DRAWINGS

FIGS. 7A-7D illustrate operations in a method of embedding an active die in a package substrate, in accordance with an embodiment.

DESCRIPTION OF EMBODIMENTS

Semiconductor packages including active package substrates are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Meeting the space constraints of next-generation memory solutions presents a challenge. In particular, as more dies are added to a memory stack, including more memory dies and/or memory controller dies, a z-height of the device may increase and z-height limitations may be exceeded. Dies may be spread out laterally to remain within z-height constraints, but doing so could increase a footprint of the device beyond customer needs.

In an aspect, a memory system is miniaturized by embedding one or more dies within a substrate of the system. For example, an active die, such as a memory controller, may be embedded in a package substrate to utilize available vertical height of the substrate and minimize z-height of the memory device. Current substrate technology has limitations on a number of pins, pad size, and pitch of embedded dies. More particularly, current substrate technology may not reliably achieve connections to embedded dies in an advanced memory system application. For example, laser drilled vias in the package substrate may not accurately align with pins of the embedded dies, and thus, current substrate technology may lead to open circuits. To avoid such a problem, an active die may be embedded between a pair of substrate layers of an active package substrate, and the embedded die may include die pads covered by an anisotropic conductive layer. For example, the anisotropic conductive layer may be an anisotropic conductive adhesive to conduct electrical current unidirectionally between vias in a substrate layer and the die pads of the active die. Accordingly, vias in the substrate layer may be accurately aligned to an embedded active die, and thus, the active die may be reliably connected to memory dies mounted on the package substrate to meet advanced memory system application needs.

Figure 1:
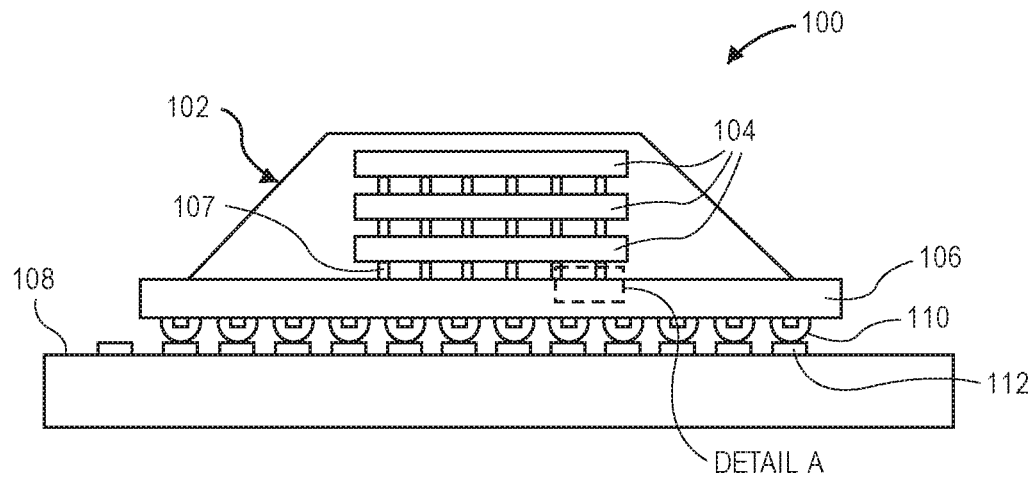
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies in communication with each other. In an embodiment, semiconductor package 102 is a memory system having one or more memory die 104 mounted on an active package substrate 106. Active package substrate 106 may be so-termed because it may include one or more embedded active dies, e.g., logic dies, as described below. For example, memory dies 104 may include solid-state non-volatile computer storage media, e.g., flash memory, and the embedded active die of active package substrate 106 may be a flash memory controller. Memory die(s) 104 may be electrically connected to other memory die(s) 104, and to conductive components of active package substrate 106, by intervening electrical bumps 107. Electrical bumps 107 may be solder bumps, or alternatively, may be another type of electrical interconnect. For example, electrical bumps 107 may include wire interconnects bonded to respective terminals, e.g., pads on vias.

In an embodiment, active package substrate 106 may be mounted on a circuit board 108. For example, semiconductor package 102 of semiconductor package assembly 100 may be ball grid array (BGA) component having several solder balls 110 arranged in a ball field. That is, an array of solder balls 110 may be arranged in a grid or other pattern. Each solder ball 110 may be mounted and attached to a corresponding contact pad 112 of circuit board 108. Circuit board 108 may be a motherboard or another printed circuit board of a computer system or device, e.g., a flash memory stick. Circuit board 108 may include signal routing to external device connectors (not shown). Accordingly, the solder ball and contact pad attachments may provide a physical and electrical interface between the dies of semiconductor package 102 and an external device.

Figure 2:
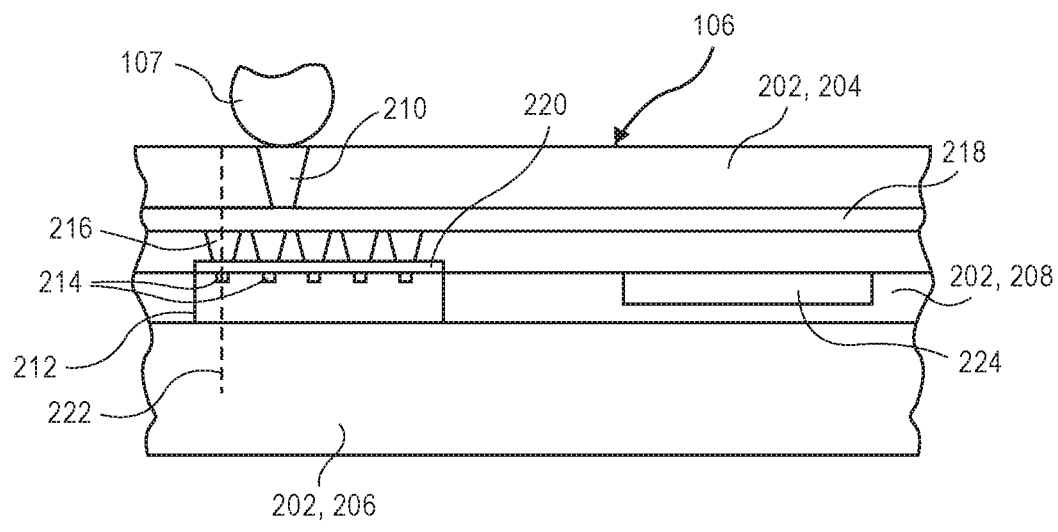
FIG. 2 illustrates a detail view taken from Detail A of FIG. 1, of an active die embedded in a package substrate, in accordance with an embodiment.

Referring to FIG. 2, a detail view taken from Detail A of FIG. 1, of an active die embedded in a package substrate is shown in accordance with an embodiment. Active package substrate 106 may include a substrate laminate 202 having several layers of dielectric materials. For example, substrate laminate 202 of active package substrate 106 may include a top substrate layer 204 physically connected to a bottom substrate layer 206 by an epoxy layer 208. The various layers of substrate laminate 202 may be formed from conventional package substrate materials, e.g., organic substrate materials.

Top substrate layer 204 may include a top surface of active package substrate 106. Thus, a bottom-most memory die 104 of the memory stack may be mounted on top substrate layer 204 of active package substrate 106. More particularly, memory die 104 may include electrical bump 107, and electrical bump 107 may be connected to an expected surface of a top layer via 210 formed in top substrate layer 204.

In an embodiment, active package substrate 106 includes an active die 212 between top substrate layer 204 and bottom substrate layer 206. Active die 212 may be a memory controller die, e.g., a flash memory controller. Thus, active die 212 may include several die pads 214 to communicate with memory dies 104 to read, write, and erase data to the non-volatile memory dies. That is, active die 212 may be a controller for managing the logic of a flash drive. In other embodiments, however, active die 212 may be a central processing unit, or another die type. Die pads 214 of active die 212 may be placed in communication with electrical bumps 107 of memory die 104 through one or more electrical interconnects. For example, top substrate layer 204 may include one or more vias, e.g., top layer via 210 and a via 216 interconnected by a lateral interconnect 218. The vias 216 and lateral interconnects 218 extending through top substrate layer 204 may carry an electrical signal between electrical bump 107 and die pad 214.

In an embodiment, active package substrate 106 may include an anisotropic conductive layer 220. Anisotropic conductive layer 220 may be between a surface of active die 212 and one or more of the layers of substrate laminate 202. For example, anisotropic conductive layer 220 may be between via 216 and die pad 214. Accordingly, anisotropic conductive layer 220 may enable the physical and electrical connection of die pads 214 and via 216. More particularly, via 216 may be electrically connected to die pad 214 through anisotropic conductive layer 220.

Anisotropic conductive layer 220 may include an anisotropic conductive adhesive. The anisotropic conductive adhesive may be a film or a paste. For example, the adhesive may include an epoxy or an acryl that conducts electrical current unidirectionally through a bulk material. For example, anisotropic conductive layer 220 may extend along a lateral plane to cover die pads 214 located on a top surface of active die 212. A vertical axis 222 may extend perpendicular to the lateral plane through die pad 214, anisotropic conductive layer 220, and via 216. In an embodiment, the anisotropic conductive adhesive may conduct electrical current unidirectionally along vertical axis 222 between via 216 and die pad 214. More particularly, the electrical current may only flow in the direction of vertical axis 222, and may not transmit horizontally through anisotropic conductive layer 220 along the lateral plane. Accordingly, the electrical current, e.g., a memory die control signal, may be communicated between die pad 214 and electrical bump 107 through top layer via 210, lateral interconnect 218, via 216, and anisotropic conductive layer 220.

Bottom substrate layer 206 may extend laterally under active die 212. For example, a bottom surface of active die 212 may be in direct contact with bottom substrate layer 206. Accordingly, active die 212 may be sandwiched between anisotropic conductive layer 220 and bottom substrate layer 206. In an embodiment, the epoxy layer 208 may surround active die 212 between top substrate layer 204 and bottom substrate layer 206. Epoxy layer 208 may extend around all sides of active die 212 such that active die 212 is embedded within substrate laminate 202. Other electronic components may be disposed within epoxy layer 208. For example, an accompanying die 224 may be located adjacent to active die 212 within epoxy layer 208 between top substrate layer 204 and bottom substrate layer 206. Accompanying die 224 may be an active logic die or a non-logic die.

Certain advantages of the structure of package assembly 100 having active package substrate 106 should now be apparent. For example, package assembly 100 having an embedded active die 212 may have a reduced z-height as compared to a similar package assembly having a memory controller located above the package substrate and within the memory stack. Certain advantages of such a structure will also become more apparent in the context of a/ manufacturing method used to build active package substrate 106, as described below.

Figure 3:
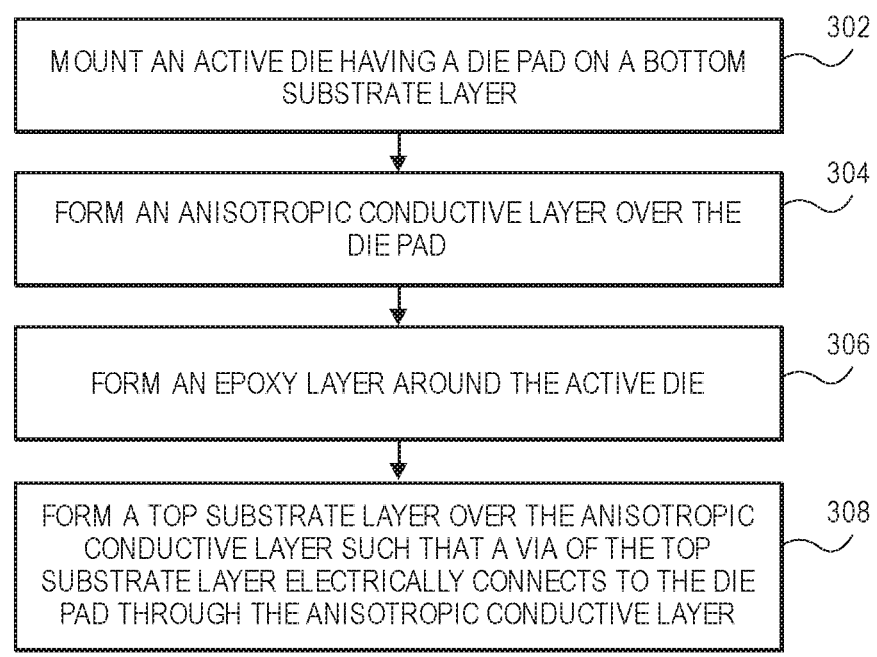
FIG. 3 illustrates a flowchart of a method of embedding an active die in a package substrate, in accordance with an embodiment.

Referring to FIG. 3, a flowchart of a method of embedding an active die in a package substrate is illustrated in accordance with an embodiment. FIGS. 4A-4D illustrate operations in the method of FIG. 3. Accordingly, FIGS. 3 and 4A-4D are described in combination below.

Figure 4A:
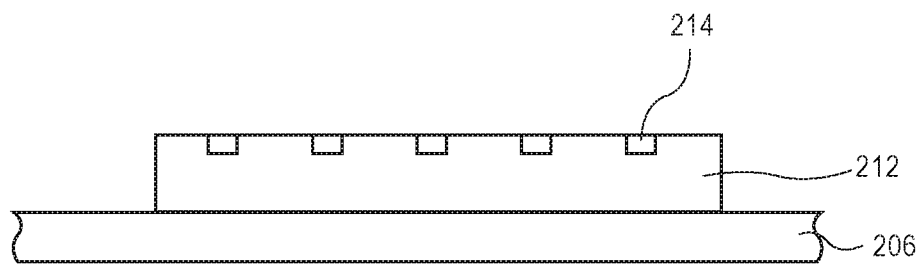
FIGS. 4A-4D illustrate operations in a method of embedding an active die in a package substrate, in accordance with an embodiment.

At operation 302, active die 212 is mounted on bottom substrate layer 206. Referring to FIG. 4A, active die 212 may include die pad 214 on an opposite side from bottom substrate layer 206. For example, active die 212 may include an active silicon material having a top surface facing away from bottom substrate layer 206, and die pad 214 may be located on the top surface. As described above, bottom substrate layer 206 may include an organic substrate material, and may be a carrier, film, substrate, etc., of substrate laminate 202.

In an embodiment, bottom substrate layer 206 is a core layer of substrate laminate 202. Accordingly, active die 212 may be mounted within a cavity formed in the core layer. In any case, a space may surround the sides of active die 212 after active die 212 is mounted on bottom substrate layer 206.

Figure 4B:
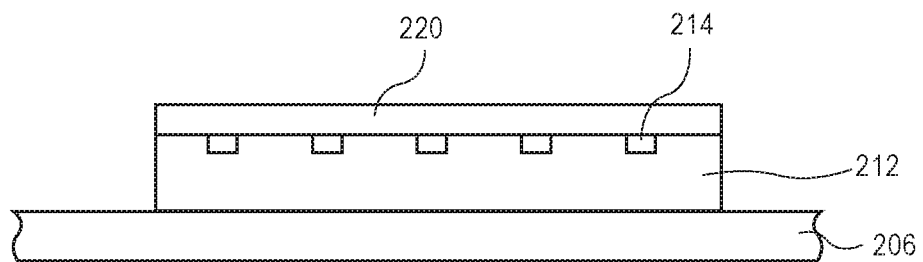

At operation 304, anisotropic conductive layer 220 may be formed over die pad 214 of active die 212. Referring to FIG. 4B, an anisotropic conductive film or an anisotropic conductive paste may be dispensed or laminated over the top surface of active die 212. That is, anisotropic conductive layer 220 may be applied on the die surface where pins, i.e., die pads 214, are exposed. The film or paste may be applied using known methods in the art, such as lamination, vacuum deposition, or a stencil. Accordingly, anisotropic conductive layer 220 may cover active die 212 such that active die 212 is between anisotropic conductive layer 220 and bottom substrate layer 206.

Figure 4C:
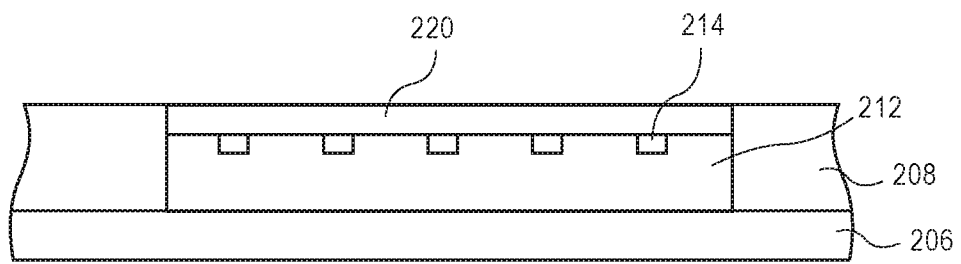

At operation 306, epoxy layer 208 may be formed around active die 212. Referring to FIG. 4C, epoxy layer 208 may surround sides of active die 212 and/or anisotropic conductive layer 220. For example, when active die 212 is mounted within a cavity of a core layer of substrate laminate 202, or when active die 212 is mounted on top of bottom substrate layer 206, the epoxy material may be applied around active die 212. Accordingly, active die 212 may be embedded within epoxy layer 208 above bottom substrate layer 206.

Figures 1, 4D:
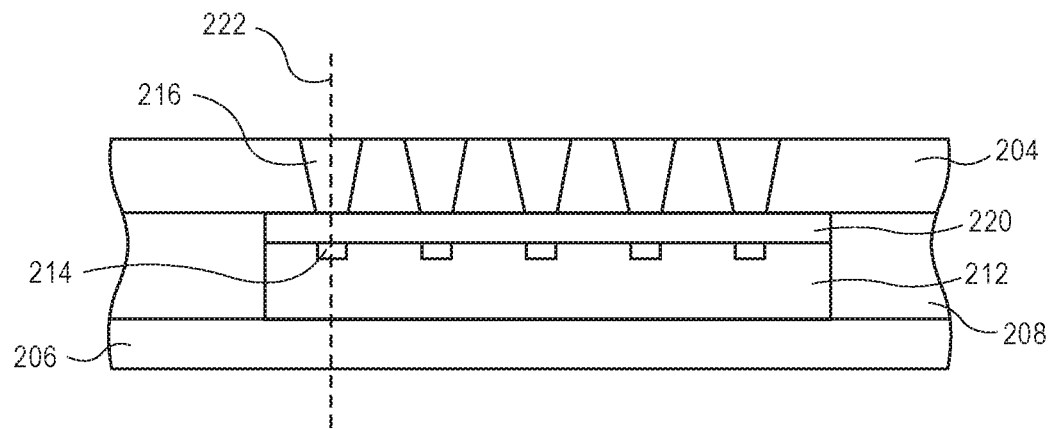
Figures 2, 4D:
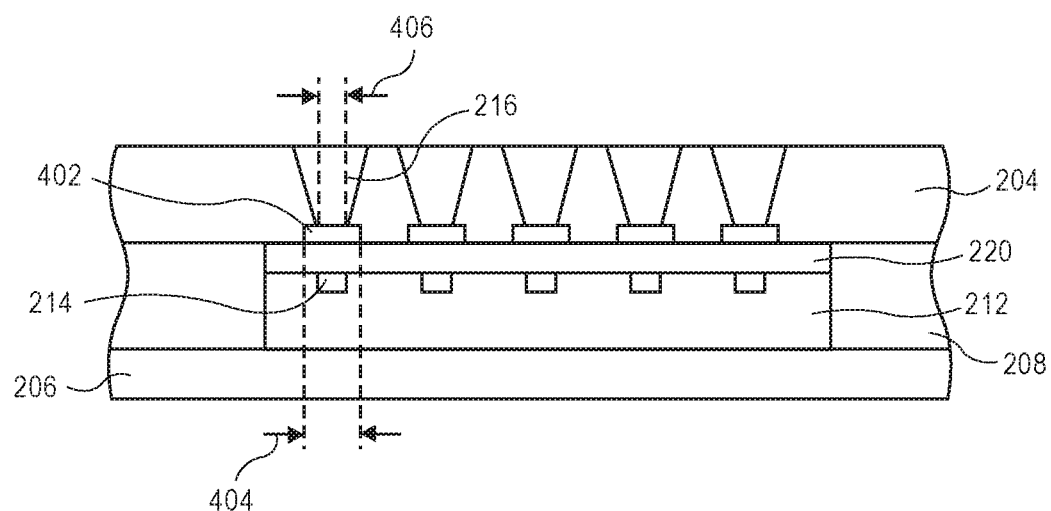

At operation 308, top substrate layer 204 may be formed over anisotropic conductive layer 220. Referring to FIG. 4D-1, top substrate layer 204 may include several vias 216. Vias 216 may be formed in top substrate layer 204 using known techniques. For example, vias 216 may be drilled and copper-plated using current substrate technology. In an embodiment, via 216 is electrically connected to die pad 214 through anisotropic conductive layer 220. More particularly, via 216 and die pad 214 may be aligned along vertical axis 222 such that electrical current is conducted along vertical axis 222 between via 216 and die pad 214 through anisotropic conductive layer 220. Epoxy layer 208 may extend around active die 212 between top substrate layer 204 and bottom substrate layer 206, and thus, active die 212 may be fully embedded within substrate laminate 202.

In an embodiment, vias 216 are formed in top substrate layer 204 after top substrate layer 204 is formed over anisotropic conductive layer 220. For example, top substrate layer 204 may be applied through a lamination process, and vias 216 may then be laser drilled along vertical axis 222 over die pad 214. By contrast, vias 216 may be formed in top substrate layer 204 before top substrate layer 204 is formed over anisotropic conductive layer 220. For example, vias 216 may be laser drilled at predetermined locations along a lateral plane of top substrate layer 204, and via 216 may be aligned with die pad 214 along vertical axis 222 when top substrate layer 204 is laminated over active die 212. In either case, vias 216 and die pads 214 may have respective axes that are closely aligned to one another. More particularly, vertical axis 222 may be drawn through via 216 and die pad 214 such that the electrical current may be conducted unidirectionally through anisotropic conductive layer 220 between the substrate components. To increase a likelihood of overlap between a surface area of via 216 and a surface area of die pad 214 along vertical axis 222, a cross-sectional area of via 216 may be larger than a cross-sectional area of die pad 214. Thus, even when there is some misalignment between via 216 and die pad 214, it is likely that an overlap between the projected surface areas of via 216 and die pad 214 will occur to allow electrical current to be carried vertically between via 216 and die pad 214.

Referring to FIG. 4D-2, in an embodiment, top substrate layer 204 is a separate interposer having vias 216. Vias 216 may be electrically connected to respective conductive pads 402, which may be solder pads formed on a bottom surface of top substrate layer 204. Accordingly, when top substrate layer 204 is placed over active die 212, conductive pad 402 may be between via 216 and anisotropic conductive layer 220. Conductive pad 402 may be attached to anisotropic conductive layer 220 using a solder reflow process, or a lamination process. Thus, electrical current may be carried along vertical axis 222 through via 216, conductive pad 402, anisotropic conductive layer 220, and die pad 214.

Conductive pads 402 may be sized to increase a likelihood of overlap between the conductive structures in top substrate layer 204 and die pads 214 of active die 212. For example, conductive pad 402 may include a lateral pad dimension 406, e.g., a pad diameter, and via 216 may include a lateral via dimension 404, e.g., a via diameter. In an embodiment, lateral pad dimension 404 is greater than lateral via dimension 406. Accordingly, a size of a surface area of conductive pad 402 facing die pad 214 may be greater than a surface area of a bottom surface of via 216. As such, die pad 214 is more likely to fall within a shadow of conductive pad 402, and thus, electrical current may be carried through anisotropic conductive layer 220 between conductive pad 402 and die pad 214.

In an embodiment, anisotropic conductive layer 220 may be applied to active die 212 prior to embedding active die 212 within substrate laminate 202. For example, operation 304 may be performed before operation 302. In such case, anisotropic conductive layer 220 may be formed over die pad 214 of active die 212, and active die 212 may then be mounted within substrate laminate 202, e.g., on bottom substrate layer 206. Accordingly, it will be appreciated that the operations described above, and an order of performing such operations, is provided by way of example and not limitation.

Figure 5:
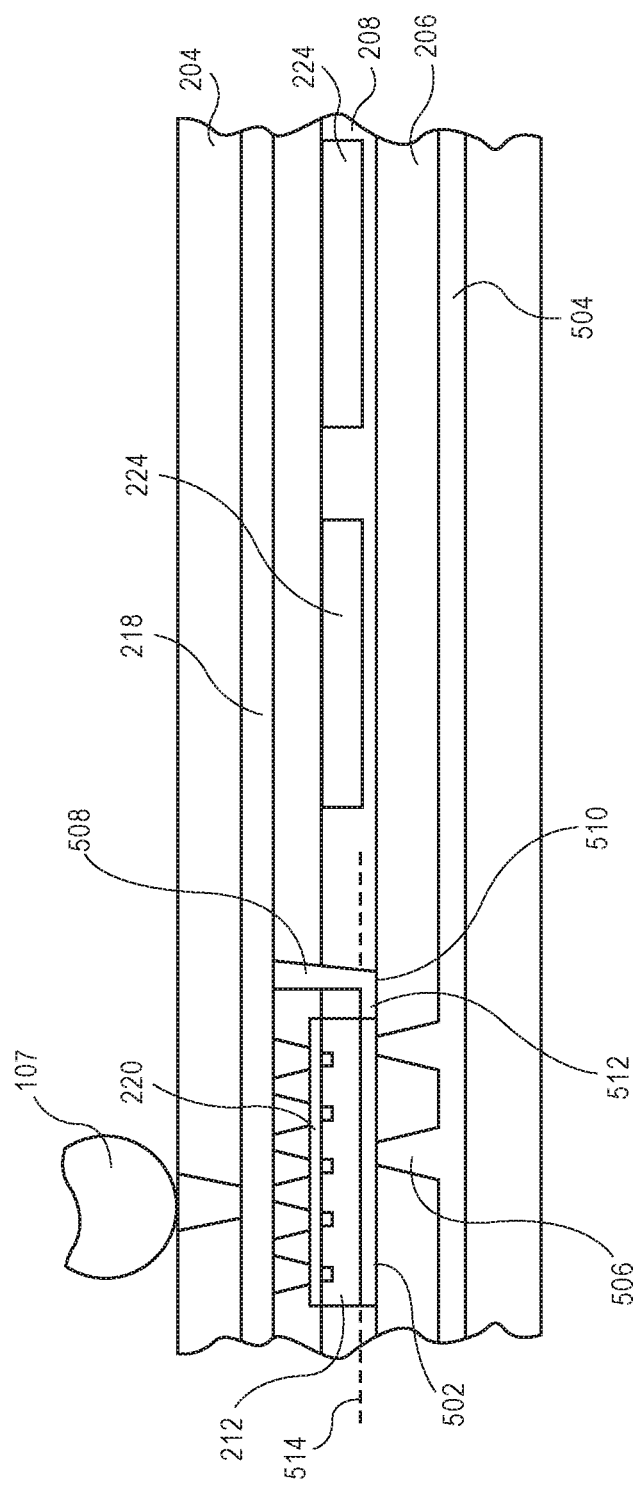
FIG. 5 illustrates a detail view taken from Detail A of FIG. 1, of an active die embedded in a package substrate.

Referring to FIG. 5, a detail view taken from Detail A of FIG. 1, of an active die embedded in a package substrate is illustrated in accordance with an embodiment. Anisotropic conductive layer 220 may enable conduction in the vertical direction to enable contact between signal routing components, e.g., lateral interconnects 218 and vias 216. In an embodiment, active die 212 is embedded in substrate laminate 202 between anisotropic conductive layer 220 and a bottom anisotropic conductive layer 502. More particularly, active package substrate 106 may include bottom anisotropic conductive layer 502 between active die 212 and bottom substrate layer 206.

Active package substrate 106 having a double-sided conductive film may include signal routing both vertically above and vertically below active die 212. Bottom substrate layer 206 may include signal routing components similar to those described above for top substrate layer 204. By way of example, one or more bottom lateral interconnect 504 may extend in a horizontal direction through bottom substrate layer 206. Furthermore, a bottom via 506 may extend in the vertical direction through bottom substrate layer 206. For example, bottom via 506 may extend between bottom lateral interconnect 504 and bottom anisotropic conductive layer 502 to route a signal from a portion of active package substrate 106 below active die 212 to another region of active package substrate 106. Accordingly, bottom via 506 may be electrically connected to bottom anisotropic conductive layer 502 below active die 212. It will be appreciated that signal routing below active die 212 is advantageous over a die embedded by conventional techniques, which would ordinarily not include conduction of signals within a shadow of an embedded die, i.e., below the embedded die.

In an embodiment, an electrical signal from lateral interconnect 218 may be carried around active die 212 by a top via 508. Top via 508 may extend through top substrate layer 204 and through epoxy layer 208 to a via end 510. Top via 508 may be laterally offset from bottom anisotropic conductive layer 502. Accordingly, a lateral interconnect 512 may extend between via end 510 and bottom anisotropic conductive layer 502 to electrically connect top via to bottom anisotropic conductive layer 502. In an embodiment, bottom anisotropic conductive layer 502 conducts electrical current along a horizontal axis 514. Horizontal axis 514 may be orthogonal to vertical axis 222, and thus, the electrical current carried through bottom anisotropic conductive layer 502 may be orthogonal to the electrical current carried through anisotropic conductive layer 220. More particularly, bottom anisotropic conductive layer 502 may conduct electrical current unidirectionally between top via 508 and bottom via 506 to provide signal routing within the shadow of active die 212. Signal routing within the shadow of active die 212 utilizes a portion of active package substrate 106 that is not used, for example, in the embodiment illustrated in FIG. 2. Accordingly, a form factor of active package substrate 106 illustrated in FIG. 5 may be less than that of active package substrate 106 illustrated in FIG. 2. Signal lines may also be routed below accompanying dies 224. Accompanying dies 224 may be active elements such as a central processing unit, or passive elements such as resistors, capacitors, or other non-logic elements.

In an embodiment, a bottom conductive layer formed from a conductive film or paste may be isotropic. More particularly, rather than conducting electrical current along the horizontal axis 514, the bottom conductive layer may carry electrical signals in all directions. Thus, electrical signals from via end 510 may be carried laterally along horizontal axis 514 to a point above bottom via 506, and then rerouted in the vertical direction along a vertical axis toward bottom via 506.

Additional signal routing structures may be realized using conductive layers disposed on active die 212. For example, a conductive layer may be patterned to form conductive columns used to enable routing unidirectionally through the layer, i.e., to form anisotropic conductive layer 220. Such a structure, and a method of forming such a structure, is described below.

Figure 6:
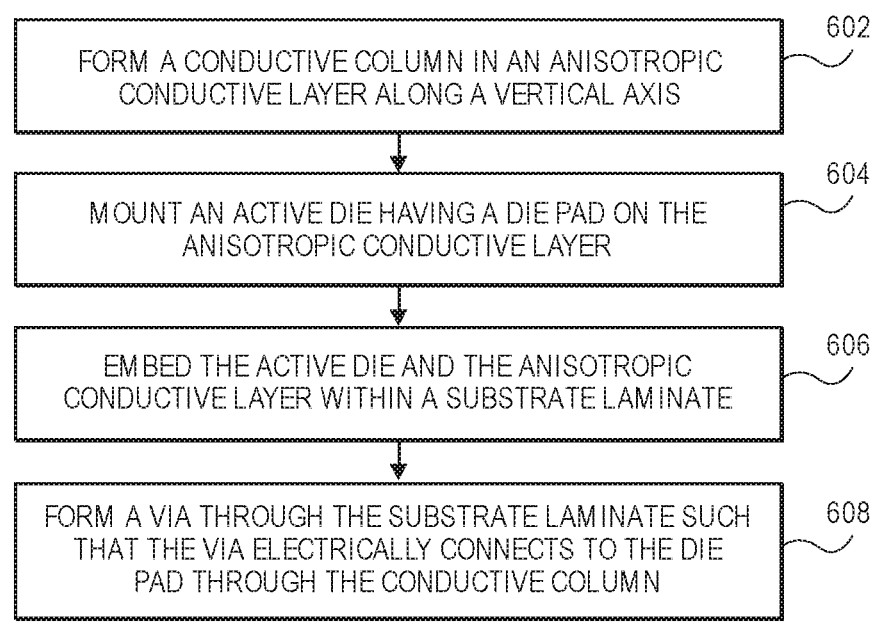
FIG. 6 illustrates a flowchart of a method of embedding an active die in a package substrate, in accordance with an embodiment.

Referring to FIG. 6, a flowchart of a method of embedding an active die in a package substrate is illustrated in accordance with an embodiment. FIGS. 7A-7D illustrate operations in the method of FIG. 6. Accordingly, FIG. 6 and FIGS. 7A-7D are described in combination below.

Referring to FIG. 7A, a conductive film, such as anisotropic conductive layer 220, may include a sacrificial layer 702. Sacrificial layer 702 may be an adhesive tape, a silicon glass, etc. Sacrificial layer 702 may allow anisotropic conductive layer 220 to be handled and to prevent a conductive column from being lost during the manufacturing method, as described below.

At operation 602, a conductive column 704 may be formed in anisotropic conductive layer 220. Referring to FIG. 7B, a portion of the conductive layer may be removed using laser drilling, mechanical milling, photolithography, and other known techniques, to form an insulating trench 706 around vertical axis 222. More particularly, insulating trench 706 may be an annular gap surrounding conductive column 704. Thus, anisotropic conductive layer 220 may include conductive column 704 extending along vertical axis 222. Conductive column 704 formed using a reduction technique may be retained by sacrificial layer 702. More particularly, sacrificial layer 702 may hold onto conductive column 704 to prevent conductive column 704 from falling away when insulating trench 706 is formed.

At operation 604, active die 212 may be mounted on anisotropic conductive layer 220. Referring to FIG. 7C, anisotropic conductive layer 220 may be placed on active die 212 such that conductive column 704 is aligned along vertical axis 222 with die pad 214. Thus, conductive column 704 may be electrically connected to die pad 214.

Anisotropic conductive layer 220 may be an adhesive that sticks to active die 212. As such, conductive column 704 may be attached to die pad 214 such that the retaining force of sacrificial layer 702 is no longer necessary. Accordingly, sacrificial layer 702 may be peeled away from anisotropic conductive layer 220.

At operation 606, active die 212 may be embedded in substrate laminate 202. Referring to FIG. 7D, active die 212 having a pre-mounted anisotropic conductive layer 220 may be mounted on bottom substrate layer 206. Epoxy layer 208 may be formed around active die 212 and anisotropic conductive layer 220, as described above. Top substrate layer 204 may be placed over anisotropic conductive layer 220 to sandwich active die 212 between top substrate layer 204 and bottom substrate layer 206.

At operation 608, via 216 may be formed through substrate laminate 202. For example, via 216 may be formed in top substrate layer 204 before or after mounting top substrate layer 204 over active die 212. Thus, via 216 may be electrically connected to die pad 214 through conductive column 704. Accordingly, anisotropic material may be patterned to form signal routing structures for carrying an electrical signal between an embedded memory controller and one or more memory dies.

Figure 8:
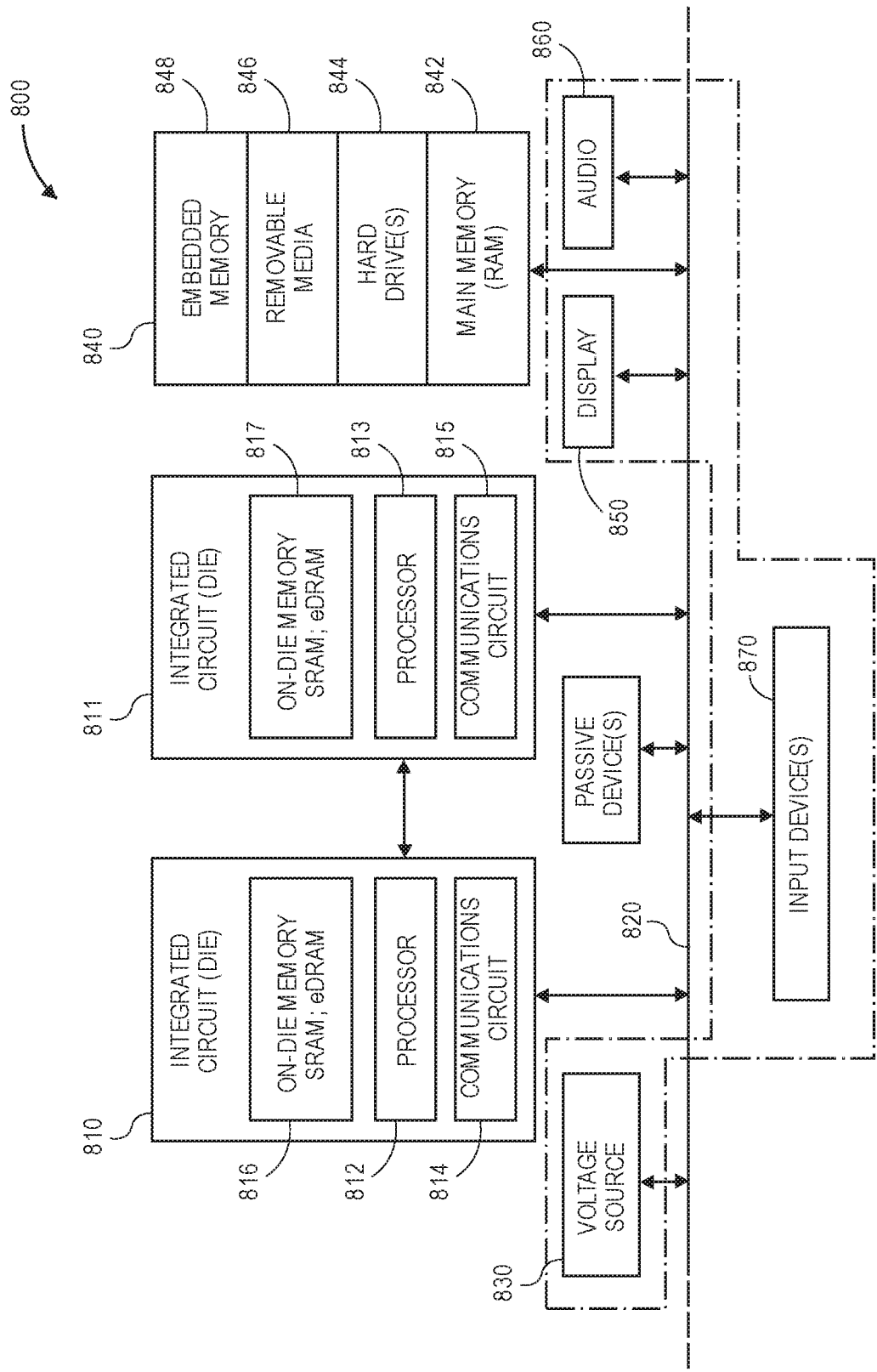
FIG. 8 is a schematic of a computer system, in accordance with an embodiment.

FIG. 8 is a schematic of a computer system, in accordance with an embodiment. The computer system 800 (also referred to as the electronic system 800) as depicted can embody a semiconductor package including an active package substrate, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, a semiconductor package including an active package substrate, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 811 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a semiconductor package including an active package substrate, according to any of the several disclosed embodiments and their equivalents, an electronic system, a computer system, one or more methods of fabricating an integrated circuit, and one or more methods of fabricating an electronic assembly that includes a semiconductor package including an active package substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a semiconductor package including an active package substrate embodiments and their equivalents. A foundation substrate may be included, as represented by the dashed line of FIG. 8. Passive devices may also be included, as is also depicted in FIG. 8.

Embodiments of a semiconductor package including an active package substrate are described above. In an embodiment, an active package substrate includes a bottom substrate layer, an active die mounted on the bottom substrate layer, a top substrate layer over the active die, and an anisotropic conductive layer between a die pad of the active die and a via of the top substrate layer. The via is electrically connected to the die pad through the anisotropic conductive layer.

In one embodiment, the anisotropic conductive layer includes an anisotropic conductive adhesive. The anisotropic conductive adhesive conducts electrical current unidirectionally along a vertical axis between the via and the die pad.

In one embodiment, the active package substrate includes an epoxy layer surrounding the active die between the top substrate layer and the bottom substrate layer.

In one embodiment, the active package substrate includes a bottom anisotropic conductive layer between the active die and the bottom substrate layer. The bottom substrate layer includes a bottom via electrically connected to the bottom anisotropic conductive layer below the active die.

In one embodiment, the active package substrate includes a top via extending through the top substrate layer and the epoxy layer to a via end laterally offset from the bottom anisotropic conductive layer. The bottom anisotropic conductive layer conducts electrical current along a horizontal axis between the top via and the bottom via.

In one embodiment, the active package substrate includes a conductive pad between the via and the anisotropic conductive layer. The conductive pad includes a lateral pad dimension greater than a lateral via dimension of the via.

In one embodiment, the anisotropic conductive layer includes a conductive column extending along the vertical axis. An insulating trench surrounds the conductive column. The via is electrically connected to the die pad through the conductive column.

In an embodiment, a semiconductor package including an active package substrate including an active die including a die pad, a top substrate layer including a via, an anisotropic conductive layer between the via and the die pad, and a memory die mounted on the top substrate layer of the active package substrate. The via is electrically connected to the die pad through the anisotropic conductive layer. The memory die includes an electrical bump connected to the via.

In one embodiment, the anisotropic conductive layer includes an anisotropic conductive adhesive. The anisotropic conductive adhesive conducts electrical current unidirectionally along a vertical axis between the via and the die pad.

In one embodiment, the semiconductor package includes a bottom substrate layer under the active die. An epoxy layer surrounds the active die between the top substrate layer and the bottom substrate layer.

In one embodiment, the semiconductor package includes a bottom anisotropic conductive layer between the active die and the bottom substrate layer. The bottom substrate layer includes a bottom via electrically connected to the bottom anisotropic conductive layer below the active die.

In one embodiment, the semiconductor package includes a top via extending through the top substrate layer and the epoxy layer to a via end laterally offset from the bottom anisotropic conductive layer. The bottom anisotropic conductive layer conducts electrical current along a horizontal axis between the top via and the bottom via.

In one embodiment, the semiconductor package includes a conductive pad between the via and the anisotropic conductive layer. The conductive pad includes a pad dimension greater than a via dimension of the via.

In one embodiment, the anisotropic conductive layer includes a conductive column extending along the vertical axis. An insulating trench surrounds the conductive column. The via is electrically connected to the die pad through the conductive column.

In an embodiment, a method of embedding an active die in a package substrate includes mounting an active die on a bottom substrate layer. The active die includes a die pad. The method includes forming an anisotropic conductive layer over the die pad. The method includes forming a top substrate layer over the anisotropic conductive layer. The top substrate layer includes a via electrically connected to the die pad through the anisotropic conductive layer.

In one embodiment, the anisotropic conductive layer includes an anisotropic conductive adhesive. The anisotropic conductive adhesive conducts electrical current unidirectionally along a vertical axis between the via and the die pad.

In one embodiment, the method includes forming an epoxy layer around the active die. The epoxy layer is between the top substrate layer and the bottom substrate layer.

In one embodiment, the method includes forming a bottom anisotropic conductive layer between the active die and the bottom substrate layer. The bottom substrate layer includes a bottom via electrically connected to the bottom anisotropic conductive layer below the active die.

In one embodiment, the method includes forming a top via through the top substrate layer and the epoxy layer. The top via includes a via end laterally offset from the bottom anisotropic conductive layer. The bottom anisotropic conductive layer conducts electrical current along a horizontal axis between the top via and the bottom via.

In one embodiment, the method includes forming a conductive column in the anisotropic conductive layer along the vertical axis. The via is electrically connected to the die pad through the conductive column.

What is claimed is:

1. An active package substrate, comprising:
   a bottom substrate layer;
   an active die mounted on the bottom substrate layer, wherein the active die includes a die pad;
   a top substrate layer over the active die, wherein the top substrate layer includes a via; and
   an anisotropic conductive layer between the die pad and the via, wherein the via is electrically connected to the die pad through the anisotropic conductive layer.

2. The active package substrate of claim 1, wherein the anisotropic conductive layer includes an anisotropic conductive adhesive, and wherein the anisotropic conductive adhesive conducts electrical current unidirectionally along a vertical axis between the via and the die pad.

3. The active package substrate of claim 2 further comprising an epoxy layer surrounding the active die between the top substrate layer and the bottom substrate layer.

4. The active package substrate of claim 3 further comprising a bottom anisotropic conductive layer between the active die and the bottom substrate layer, wherein the bottom substrate layer includes a bottom via electrically connected to the bottom anisotropic conductive layer below the active die.

5. The active package substrate of claim 4 further comprising a top via extending through the top substrate layer and the epoxy layer to a via end laterally offset from the bottom anisotropic conductive layer, wherein the bottom anisotropic conductive layer conducts electrical current along a horizontal axis between the top via and the bottom via.

6. The active package substrate of claim 2 further comprising a conductive pad between the via and the anisotropic conductive layer, wherein the conductive pad includes a lateral pad dimension greater than a lateral via dimension of the via.

7. The active package substrate of claim 2, wherein the anisotropic conductive layer includes a conductive column extending along the vertical axis, wherein an insulating trench surrounds the conductive column, and wherein the via is electrically connected to the die pad through the conductive column.

8. A semiconductor package, comprising:
   an active package substrate including
      an active die including a die pad,
      a top substrate layer including a via, and
      an anisotropic conductive layer between the via and the die pad, wherein the via is electrically connected to the die pad through the anisotropic conductive layer; and
   a memory die mounted on the top substrate layer of the active package substrate, wherein the memory die includes an electrical bump connected to the via.

9. The semiconductor package of claim 8, wherein the anisotropic conductive layer includes an anisotropic conductive adhesive, and wherein the anisotropic conductive adhesive conducts electrical current unidirectionally along a vertical axis between the via and the die pad.

10. The semiconductor package of claim 9 further comprising:
    a bottom substrate layer under the active die; and
    an epoxy layer surrounding the active die between the top substrate layer and the bottom substrate layer.

11. The semiconductor package of claim 10 further comprising a bottom anisotropic conductive layer between the active die and the bottom substrate layer, wherein the bottom substrate layer includes a bottom via electrically connected to the bottom anisotropic conductive layer below the active die.

12. The semiconductor package of claim 11 further comprising a top via extending through the top substrate layer and the epoxy layer to a via end laterally offset from the bottom anisotropic conductive layer, wherein the bottom anisotropic conductive layer conducts electrical current along a horizontal axis between the top via and the bottom via.

13. The semiconductor package of claim 9 further comprising a conductive pad between the via and the anisotropic conductive layer, wherein the conductive pad includes a pad dimension greater than a via dimension of the via.

14. The semiconductor package of claim 9, wherein the anisotropic conductive layer includes a conductive column extending along the vertical axis, wherein an insulating trench surrounds the conductive column, and wherein the via is electrically connected to the die pad through the conductive column.

15. A method, comprising:
    mounting an active die on a bottom substrate layer, wherein the active die includes a die pad;
    forming an anisotropic conductive layer over the die pad; and
    forming a top substrate layer over the anisotropic conductive layer, wherein the top substrate layer includes a via electrically connected to the die pad through the anisotropic conductive layer.

16. The method of claim 15, wherein the anisotropic conductive layer includes an anisotropic conductive adhesive, and wherein the anisotropic conductive adhesive conducts electrical current unidirectionally along a vertical axis between the via and the die pad.

17. The method of claim 16 further comprising forming an epoxy layer around the active die, wherein the epoxy layer is between the top substrate layer and the bottom substrate layer.

18. The method of claim 17 further comprising forming a bottom anisotropic conductive layer between the active die and the bottom substrate layer, wherein the bottom substrate layer includes a bottom via electrically connected to the bottom anisotropic conductive layer below the active die.

19. The method of claim 18 further forming a top via through the top substrate layer and the epoxy layer, wherein the top via includes a via end laterally offset from the bottom anisotropic conductive layer, and wherein the bottom anisotropic conductive layer conducts electrical current along a horizontal axis between the top via and the bottom via.

20. The method of claim 16 further comprising forming a conductive column in the anisotropic conductive layer along the vertical axis, wherein the via is electrically connected to the die pad through the conductive column.

* * * * *